US012652776B2

(12) United States Patent (10) Patent No.: US 12,652,776 B2
Tsorng et al. (45) Date of Patent: Jun. 9, 2026

(54) MECHANISM FOR SECURING SERVER MODULE IN SERVER CHASSIS AND SERVER HAVING SAME

(71) Applicant: Quanta Computer Inc., Taoyuan City (TW)

(72) Inventors: Yaw-Tzorng Tsorng, Taoyuan City (TW); Ming-Lung Wang, Taoyuan City (TW); Hung-Wei Chen, Taoyuan City (TW); Li-Yang Huang, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 97 days.

(21) Appl. No.: 18/898,314

(22) Filed: Sep. 26, 2024

(65) Prior Publication Data

US 2026/0089864 A1 Mar. 26, 2026

(51) Int. Cl.
H05K 7/14 (2006.01)
(52) U.S. Cl.
CPC ................................. H05K 7/1489 (2013.01)
(58) Field of Classification Search
CPC .. H05K 7/1409; H05K 7/1489; H05K 7/1411; G06F 1/187
See application file for complete search history.

(56) References Cited

U.S. PATENT DOCUMENTS

| | | | | |
|---|---|---|---|---|
| 4,521,063 A | * | 6/1985 | Milc | H05K 7/1409 439/55 |
| 5,414,594 A | * | 5/1995 | Hristake | H05K 7/1409 439/153 |
| 2006/0023430 A1 | | 2/2006 | Karstens | |
| 2013/0130528 A1 | * | 5/2013 | Jun | H05K 7/1409 439/160 |

FOREIGN PATENT DOCUMENTS

CN 219936367 U 10/2023

OTHER PUBLICATIONS

TW Office Action for Application No. 113151411 mailed Jan. 15, 2026, w/ Summary, 5 pp.
TW Search Report for Application No. 113151411 mailed Jan. 15, 2026, w/ First Office Action, 11 p.

* cited by examiner

*Primary Examiner* — James Wu
(74) *Attorney, Agent, or Firm* — NIXON PEABODY LLP

(57) ABSTRACT

A server or server chassis is disclosed. The server or server chassis includes a base having a slot configured to receive a server module on a base plate, a pair of levers coupled to the base, and a pair of adjustable pins coupled to the base plate. Each adjustable pin of the pair of adjustable pins is configured to engage with a corresponding one of the pair of levers, and each adjustable pin is movable relative to the base plate. In various embodiments, the adjustable pin includes a pin base; an elongated body coupled to the pin base and passing through a corresponding one of a pair of through-holes of the base plate; a locking ball positioned at a portion of the elongated body and configured to be in an expanded state or in a retracted state; and a cap coupled to the elongated body.

20 Claims, 7 Drawing Sheets

400

405

403

401

500

505

503

507

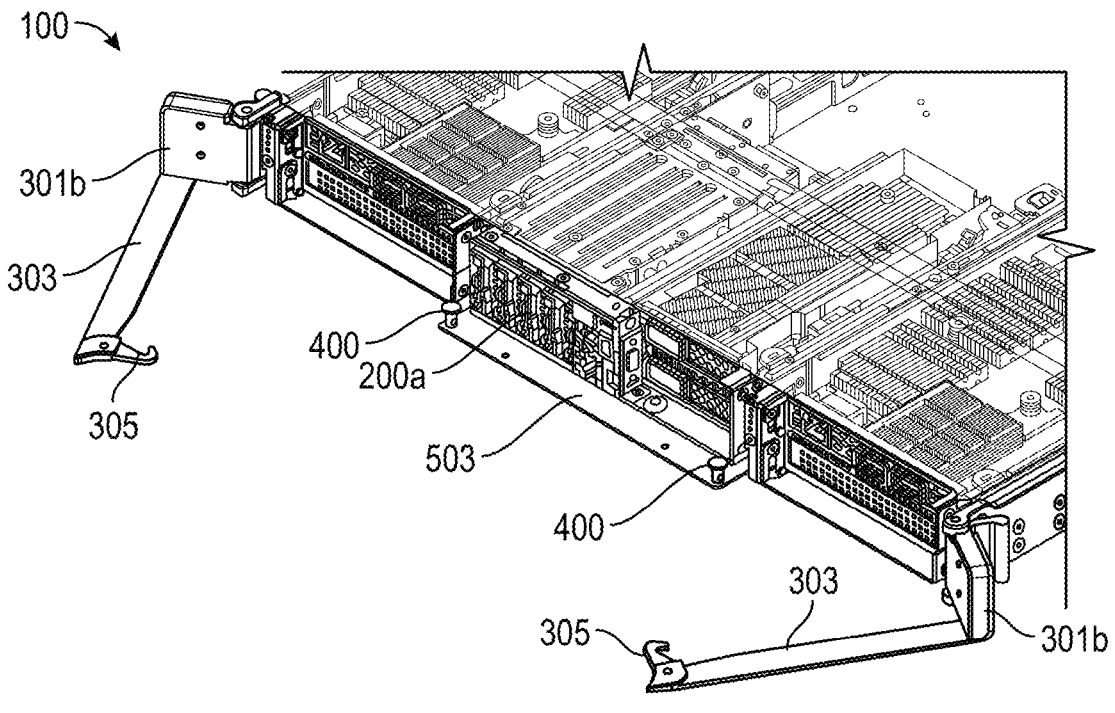
FIG. 6
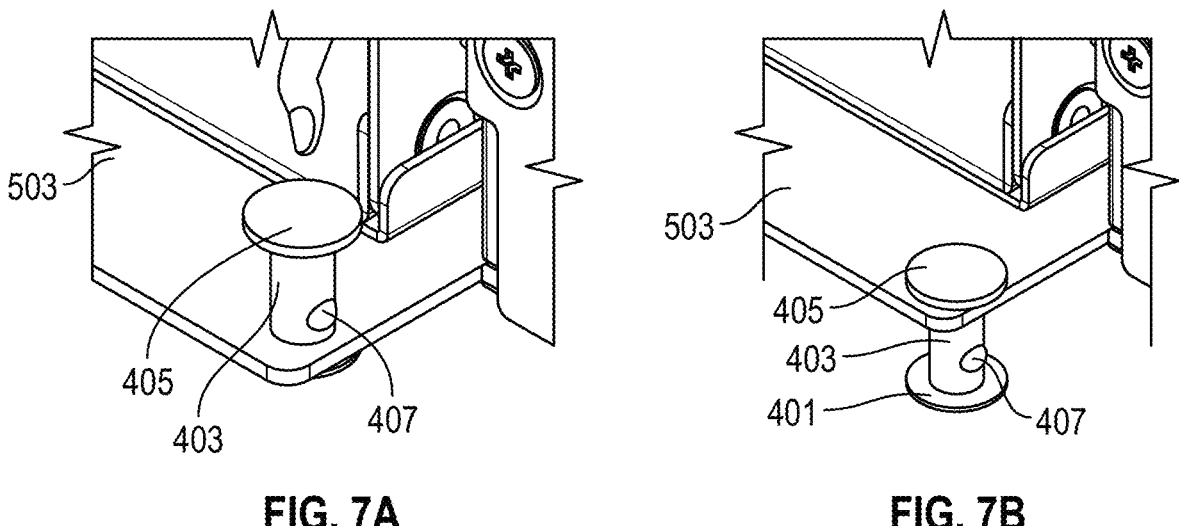
FIG. 7A          FIG. 7B

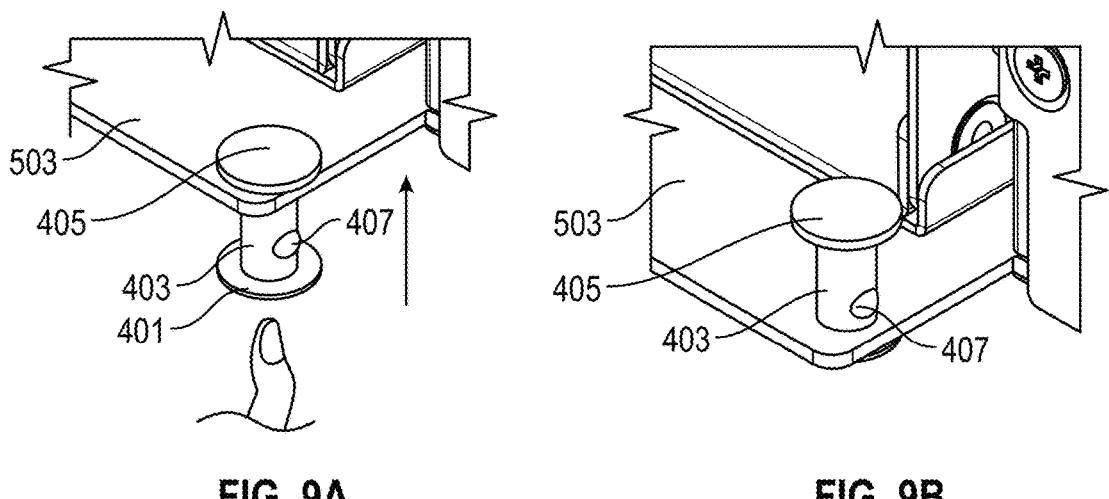
FIG. 9A
FIG. 9B
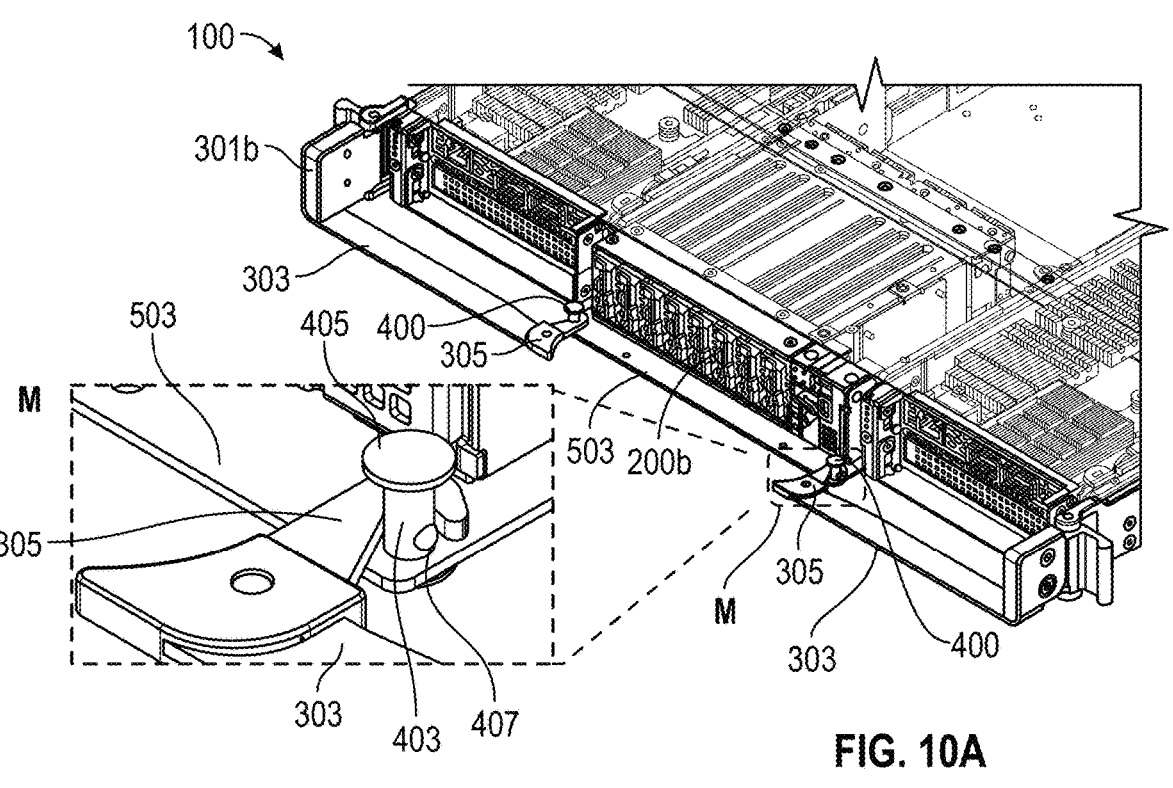
FIG. 10A
FIG. 10B

MECHANISM FOR SECURING SERVER MODULE IN SERVER CHASSIS AND SERVER HAVING SAME

FIELD OF THE INVENTION

The present invention relates generally to a server chassis, and more specifically, to a server chassis with a space-saving lever mechanism for securing a server module therein.

BACKGROUND OF THE INVENTION

Routine maintenance and repairs on servers oftentimes require pulling server modules out of a server chassis. In general, a lever mechanism is installed on the server chassis to secure the server modules therein. For example, as illustrated in FIGS. 1A and 1B, the lever mechanism 600 has a hook structure that needs to be engaged with a hook engaging structure 700. In prior art servers, the hook engaging structure 700 is generally installed on a front panel 800 of the server. To secure the server module in the server chassis, the hook structure of the lever mechanism 600 is engaged with the hook engaging structure 700 installed on the front panel 800, as shown in FIG. 1A. Further, to release the server module out of the server chassis, the lever mechanism 600 is disengaged from the hook engaging structure 700, as shown in FIG. 1B. Although the hook engaging structure 700 engaging with the lever mechanism 600 is required to secure the server module in the server chassis, the hook engaging structure 700 occupies a valuable space of the front panel 800, causing inefficient space usage.

Therefore, a need exists for an improved mechanism for securing server modules in a server chassis without sacrificing the space available on the front panel of the server chassis. Further, the space on the front panel should not be affected by the lever mechanism for securing the server modules, or the space occupied by the lever mechanism should be minimized. The present disclosure is directed to such a lever mechanism that provides an easy solution for saving space on the front panel by employing an adjustable pin that engages with the lever mechanism without being installed on the front panel.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a server chassis is disclosed. The server chassis includes a base having at least one slot configured to receive a server module on a base plate, a pair of levers coupled to the base, and a pair of adjustable pins coupled to the base plate. Each adjustable pin of the pair of adjustable pins is configured to engage with a corresponding one of the pair of levers. Each adjustable pin is movable relative to the base plate.

In some embodiments, the base includes a first side wall formed at one edge of the base plate and a second side wall formed at another edge of the base plate. In some embodiments, one of the pair of levers is coupled to the first side wall, and another one of the pair of levers is coupled to the second side wall.

In some embodiments, each of the pair of levers includes a lever base coupled to the first or second side wall of the base, an arm coupled to the lever base, and a hook structure coupled to the arm.

In some embodiments, the lever base includes a fixed portion coupled to the first or second side wall of the base.

In some embodiments, the lever base further includes a movable portion pivotably coupled to the fixed portion. The arm is coupled to the movable portion.

In some embodiments, the lever base further includes a tab extending from the movable portion. The tab is configured to receive a user input for moving the arm. The user input causes the pair of levers to be disengaged from the pair of adjustable pins, or the pair of levers are engaged with the pair of adjustable pins in response to movement of the arm.

In some embodiments, the hook structure is pivotably coupled to the arm.

In some embodiments, the hook structure is configured to engage with a corresponding one of the pair of adjustable pins.

In some embodiments, each of the pair of adjustable pins is inserted into a corresponding through-hole of the base plate.

In some embodiments, each of the pair of adjustable pins includes a pin base, an elongated body passing through the through-hole of the base plate, and a cap. One end of the elongated body is coupled to the pin base, and another end of the elongated body is coupled to the cap.

In some embodiments, the elongated body of the adjustable pin has a generally cylindrical shape.

In some embodiments, the cap is removably coupled to the elongated body.

In some embodiments, the pin base is located below the base plate, and the cap is located above the base plate.

In some embodiments, the adjustable pin is configured to be positioned in either a raised configuration or a lowered configuration. Positioning of the adjustable pin is according to movement of the adjustable pin through the through-hole of the base plate.

In some embodiments, the hook structure is configured to engage with the adjustable pin when the adjustable pin is positioned in the raised configuration. The hook structure cannot engage with the adjustable pin when the adjustable pin is positioned in the lowered configuration.

According to certain aspects of the present disclosure, a server is disclosed. The server includes a base. The base includes a base plate with a pair of through-holes, a first side wall formed at one edge of the base plate, and a second side wall formed at another edge of the base plate. The base has at least one slot configured to receive a server module. The server further includes a pair of levers. One of the pair of levers is coupled to the first side wall, and another one of the pair of levers is coupled to the second side wall. The server further includes a pair of adjustable pins coupled to the base plate. Each adjustable pin of the pair of adjustable pins is configured to engage with a corresponding one of the pair of levers. The adjustable pin includes a pin base, an elongated body, a locking ball, and a cap. The elongated body passes through a corresponding one of the pair of through-holes of the base plate. One end of the elongated body is coupled to the pin base. The locking ball is positioned at a portion of the elongated body. The locking ball is configured to be in an expanded state or in a retracted state. The cap is coupled to another end of the elongated body.

In some embodiments, each adjustable pin is movable relative to the base plate to be positioned in either a raised configuration or a lowered configuration. Positioning of the adjustable pin is according to movement of the adjustable pin through the corresponding through-hole of the base plate.

In some embodiments, the pair of levers are configured to be closed to secure the received server module within the base, and the pair of levers are configured to be opened to allow pulling out the server module from the slot or the base.

In some embodiments, when the adjustable pin is positioned in the raised configuration, the cap is positioned away from a top side of the base plate, and the pin base is positioned close to or in contact with a bottom side of the base plate. Further, when the adjustable pin is positioned in the lowered configuration, the pin base is positioned away from the bottom side of the base plate, and the cap is positioned close to or in contact with the top side of the base plate.

In some embodiments, when the adjustable pin is positioned in the raised configuration, the locking ball positioned above the base plate is in the expanded state. Further, when the adjustable pin is positioned in the lowered configuration, the locking ball positioned below the base plate is in the expanded state.

In some embodiments, in response to a push input received on the cap of the adjustable pin that is positioned in the raised configuration, the adjustable pin is configured to be lowered or move downward. The expanded locking ball is retracted upon contacting the base plate of the base to allow the adjustable pin pass through the through-hole of the base plate, and the retracted locking ball is expanded after the locking ball passes through the through-hole of the base plate. Eventually, the adjustable pin is positioned in the lowered configuration.

In some embodiments, in response to a push input received on the pin base of the adjustable pin that is positioned in the lowered configuration, the adjustable pin is configured to be raised or move upward. The expanded locking ball is retracted upon contacting the base plate of the base to allow the adjustable pin pass through the through-hole of the base plate, and the retracted locking ball is expanded after the locking ball passes through the through-hole of the base plate. Eventually, the adjustable pin is positioned in the raised configuration.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 6 is a generally perspective view of the server chassis shown in FIG. 2A, according to certain aspects of the present disclosure, the lever being in a closed position in FIG. 2A and the lever being in an open position in FIG. 6.

FIG. 7A is a generally perspective view of an adjustable pin positioned in a raised configuration, according to certain aspects of the present disclosure. FIG. 7A also illustrates pushing down the adjustable pin while a lever is in a closed configuration, according to certain aspects of the present disclosure.

FIG. 7B is a generally perspective view of the adjustable pin shown in FIG. 7A that is positioned in a lowered configuration, according to certain aspects of the present disclosure. As a result of pushing down the adjustable pin, as shown in FIG. 7A, the adjustable pin is now in the lowered configuration, according to certain aspects of the present disclosure.

FIG. 9A illustrates pushing up an adjustable pin that is in a lowered configuration, according to certain aspects of the present disclosure.

FIG. 9B illustrates the adjustable pin in a raised configuration as a result of pushing up the adjustable pin, as shown in FIG. 9A, according to certain aspects of the present disclosure.

FIG. 10A illustrates levers engaged with respective adjustable pins, according to certain aspects of the present disclosure.

FIG. 10B shows a magnified view of area M shown in FIG. 10A.

Figures 1A, 1B:
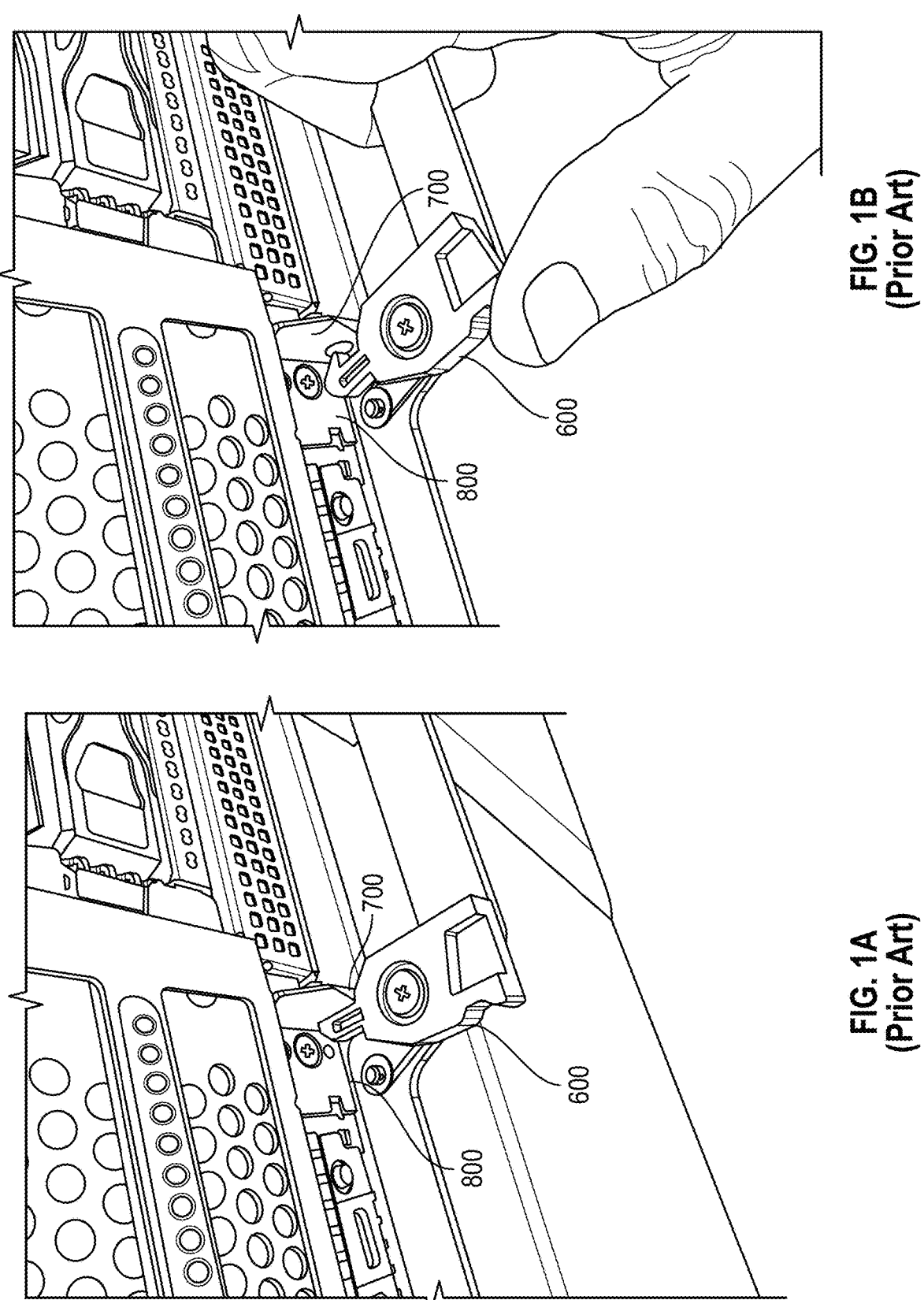
FIGS. 1A and 1B show a prior art lever mechanism of a server.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

The present disclosure relates to a server chassis with adjustable pins configured to engage with respectively corresponding levers. The adjustable pins are coupled to a base plate of a base having at least one slot configured to receive a server module. By having the adjustable pins on the base plate of the server chassis, levers can engage with respectively corresponding adjustable pins regardless of the types of server modules received in the server chassis. Therefore, the same levers can be used without being replaced when the server module installed within the server chassis is replaced with a different type of server module having a different dimension.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2A:
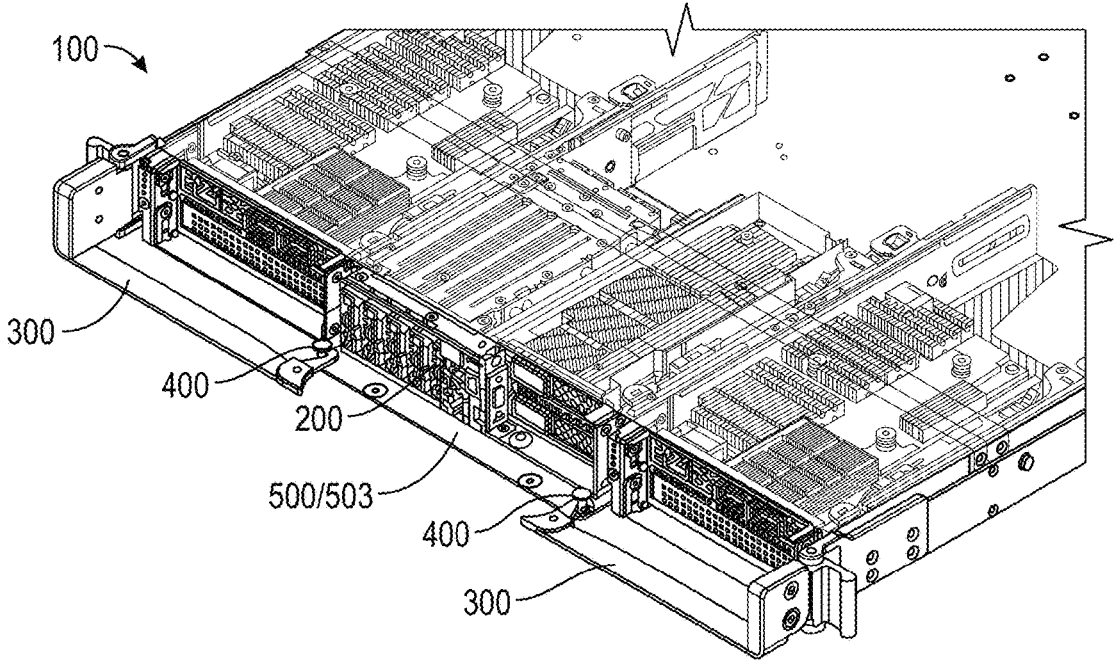
FIG. 2A is a generally perspective partial view of a server chassis, according to certain aspects of the present disclosure.
Figure 2B:
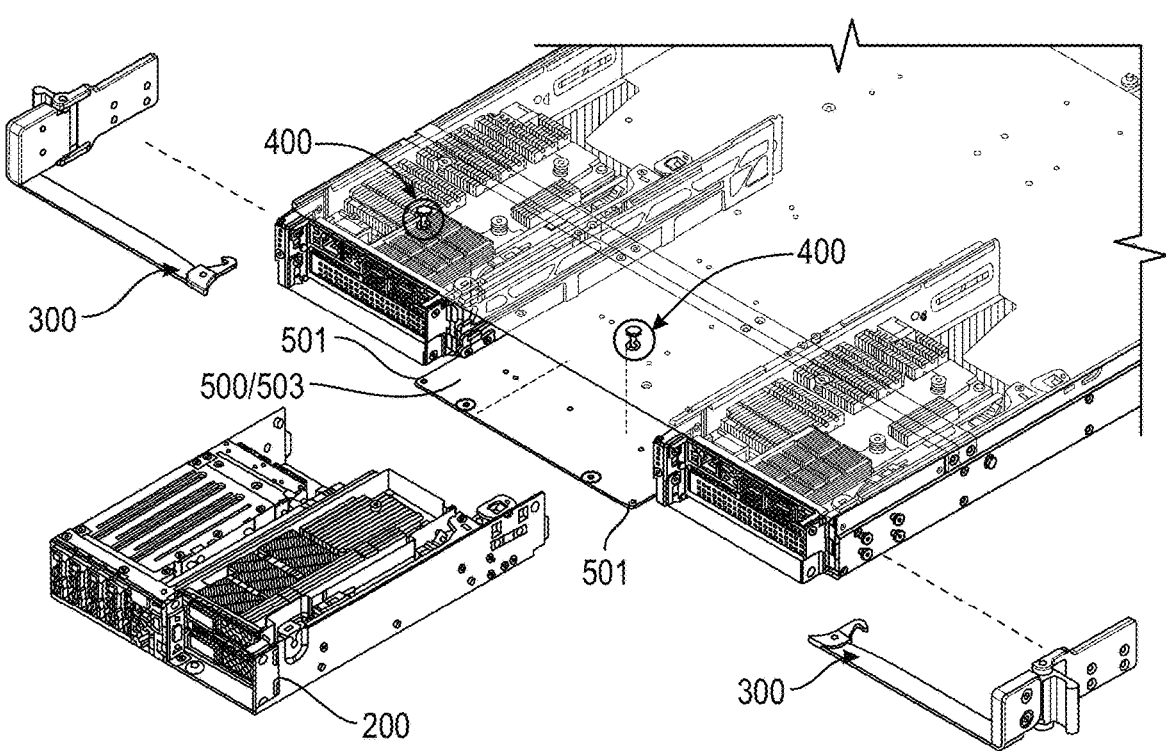
FIG. 2B is an exploded view of the server chassis shown in FIG. 2A, according to certain aspects of the present disclosure.

Referring to FIG. 2A, a server chassis 100 has a server module 200 installed therein. Referring to FIG. 2B, the server module 200 can be pulled out of the server chassis 100. Referring to FIGS. 2A and 2B, according to various embodiments, the server chassis 100 includes levers 300 that engage with respective adjustable pins 400 to secure the server module 200 installed in the server chassis 100. The adjustable pins 400 are coupled to a base 500 or base plate 503 of the server chassis 100. For example, the adjustable pins 400 are inserted into respective through-holes 501 of the base plate 503. The base 500 has at least one slot configured to receive the server module 200 on the base plate 503. The levers 300 are coupled to the base 500. For example, the levers 300 are fastened to the base 500 by fasteners (not shown in drawings).

Figure 3:
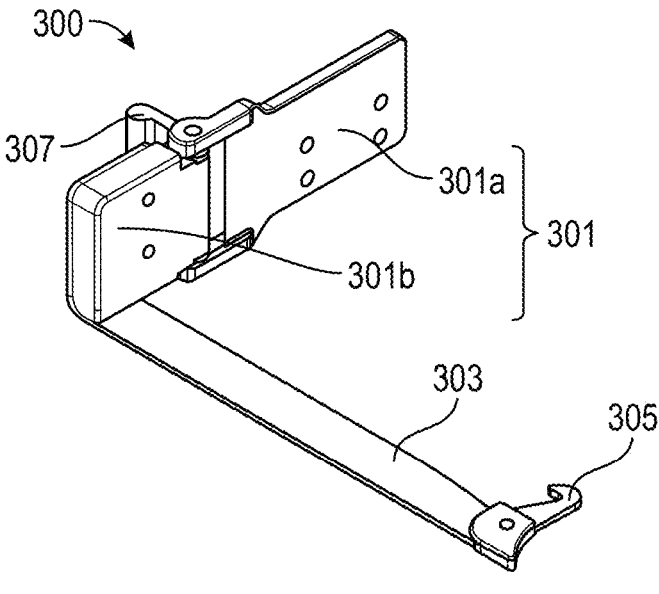
FIG. 3 is a generally perspective view of a lever, according to certain aspects of the present disclosure.

Referring to FIG. 3, the lever 300 includes a lever base 301, an arm 303, and a hook structure 305 coupled to the arm 303. The lever base 301 includes a fixed portion 301$a$ and a movable portion 301$b$. The lever base 301 further includes a tab 307 extending from the movable portion 301$b$. The tab 307 is configured to receive a user input.

Figure 4A:
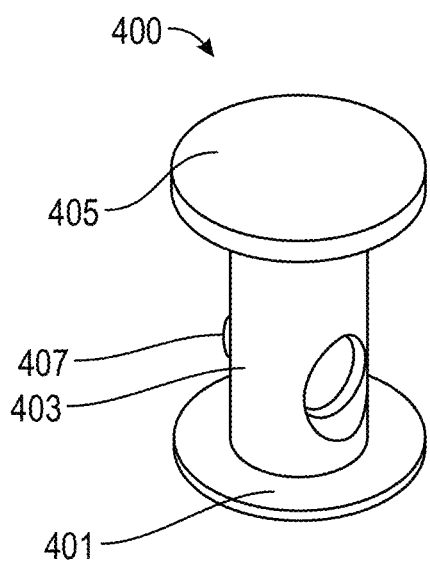
FIG. 4A is a generally perspective view of an adjustable pin, according to certain aspects of the present disclosure.
Figures 4B, 5:
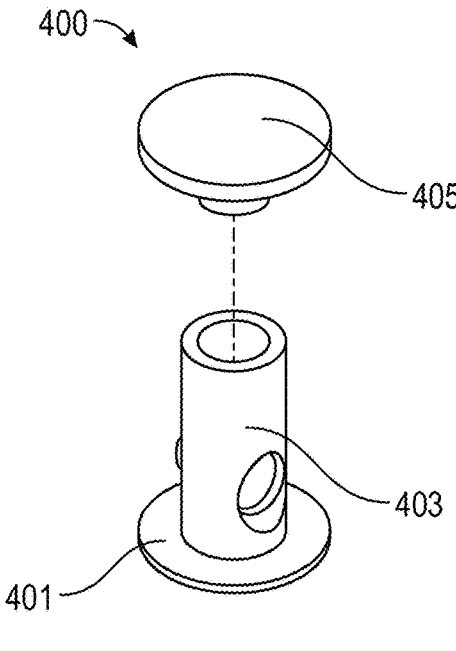
FIG. 4B is a disassembled view of the adjustable pin shown in FIG. 4A, according to certain aspects of the present disclosure.
FIG. 5 is a generally perspective view of a base, according to certain aspects of the present disclosure.

Referring to FIGS. 4A and 4B, the adjustable pin 400 includes a pin base 401, an elongated body 403, and a cap 405. The pin base 401 is coupled to one end of the elongated body 403, and the cap 405 is coupled to another end of the elongated body 403. The elongated body 403 has a generally cylindrical shape. The adjustable pin 400 further includes a locking ball 407 positioned at a portion of the elongated body 403. The locking ball 407 is configured to be in an expanded state or in a retracted state. For example, the locking ball 407 is configured to be pushed into the elongated body 403 in response to pressure applied to the locking ball 407.

Referring to FIG. 5, the base 500 includes a first side wall 505 formed at one edge of the base plate 503 and a second side wall 507 formed at another edge of the base plate 503. In some embodiments, through-holes (shown in FIG. 2B) may be formed on the base plate 503 by drilling, if the base plate 503 does not have pre-formed through-holes.

Referring to FIG. 6, the lever 300 is configured to be disengaged from the adjustable pin 400. While the lever 300 shown in FIG. 2A is engaged with the adjustable pin 400, the lever 300 shown in FIG. 6 is disengaged from the adjustable pin 400. The lever base 301 is coupled to the first side wall 505 or second side wall 507 of the base 500. In particular, the fixed portion 301$a$ of the lever base 301 is coupled to the first 505 or second 507 side wall of the base 500. The movable portion 301$b$ of the lever base 301 is pivotably coupled to the fixed portion 301$a$. Further, the arm 303 is coupled to the movable portion 301$b$ of the lever base 301.

The tab 307 of the lever 300 is configured to receive a user input for moving the arm 303. By moving the arm 303 in a state as shown in FIG. 2A, the levers 300 are disengaged from the adjustable pins 400, as shown in FIG. 6. Or by moving the arm 303 in a state as shown in FIG. 6, the levers 300 are engaged with the adjustable pins 400, as shown in FIG. 10A. In particular, the hook structures 305 of the levers 300 are engaged with or disengaged from the adjustable pins 400 when the arms 303 are moved in response to the user input.

Referring to FIGS. 7A and 7B, the adjustable pin 400 is inserted into a corresponding through-hole 501 (shown in FIG. 2B) of the base plate 503. The adjustable pin 400 is movable relative to the base plate 503. The pin base 401 of the adjustable pin 400 is located below the base plate 503, and the cap 405 is located above the base plate 503. The adjustable pin 400 is configured to be positioned in a raised configuration, as shown in FIG. 7A, or in a lowered configuration, as shown in FIG. 7B. Positioning of the adjustable pin 400 is according to movement of the adjustable pin 400 through the through-hole 501 of the base plate 503. The hook structure 305 of the lever 300 is configured to engage with the adjustable pin 400 when the adjustable pin 400 is positioned in the raised configuration. Once the lever 300 is disengaged from the adjustable pin 400, as shown in FIG. 6, the adjustable pin 400 is still in the raised configuration, as shown in FIG. 7A. The adjustable pin 400 is configured to be lowered in response to a user input (a finger pushing the cap 405 of the adjustable pin 400, as shown in FIG. 7A). In response to the user input, the adjustable pin 400 is lowered to the lowered configuration, as shown in FIG. 7B. While the adjustable pin 400 is in the lowered configuration, the hook structure 305 of the lever 300 cannot engage with the adjustable pin 400. In both the raised configuration and the lowered configuration, the locking ball 407 of the adjustable pin 400 is in the expanded state, i.e., protrudes from the elongated body 403. The adjustable pin 400 is configured to be lowered or move downward in response to the user input. The expanded locking ball is retracted upon contacting the base plate 503 of the base 500 to allow the adjustable pin 400 pass through the through-hole 501 of the base plate 503. Thereafter, the retracted locking ball 407 is expanded after the locking ball 407 passes through the through-hole 501 of the base plate 503. Then, the adjustable pin 400 is eventually positioned in the lowered configuration.

Figure 8A:
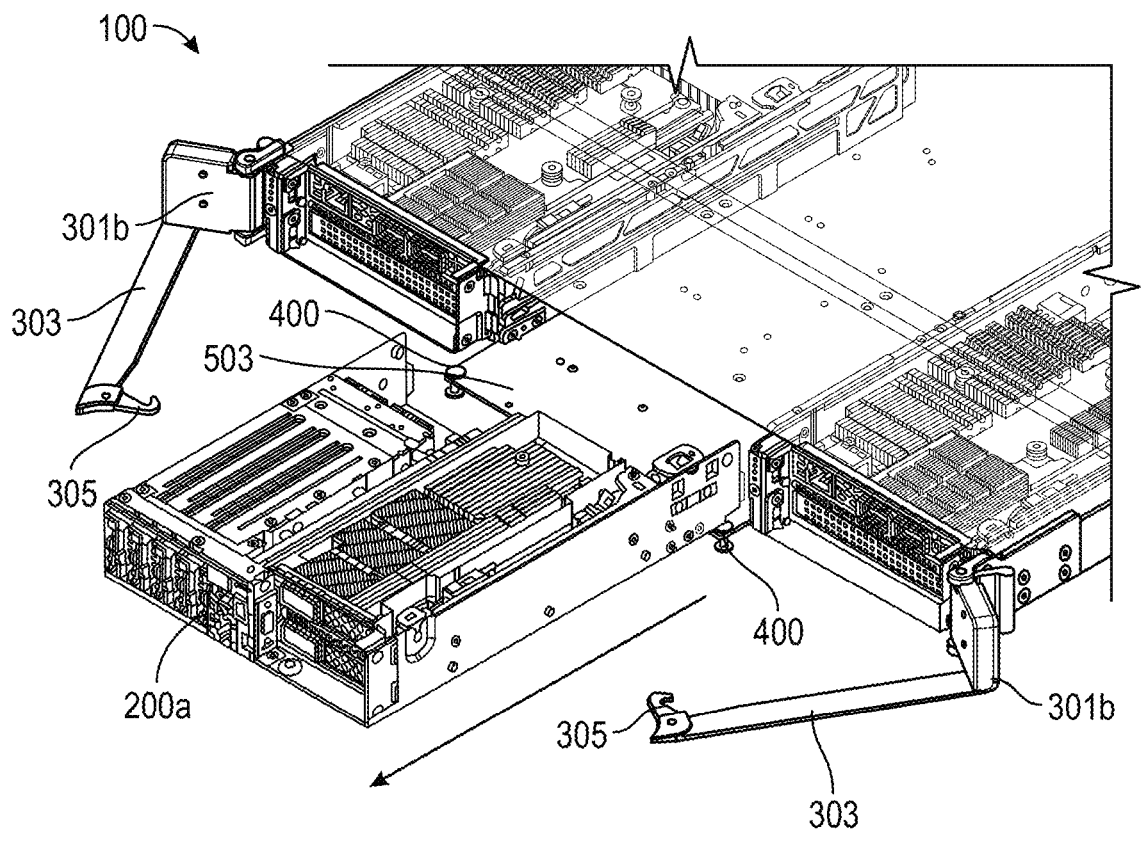
FIG. 8A illustrates pulling out a server module out of a server chassis by placing a lever in an open position, according to certain aspects of the present disclosure.

Referring to FIG. 8A, after the lever 300 is disengaged from the adjustable pin 400 and then the adjustable pin 400 is lowered to the lowered configuration in response to the user input, the server module 200a can be pulled out of the server chassis 100.

Figure 8B:
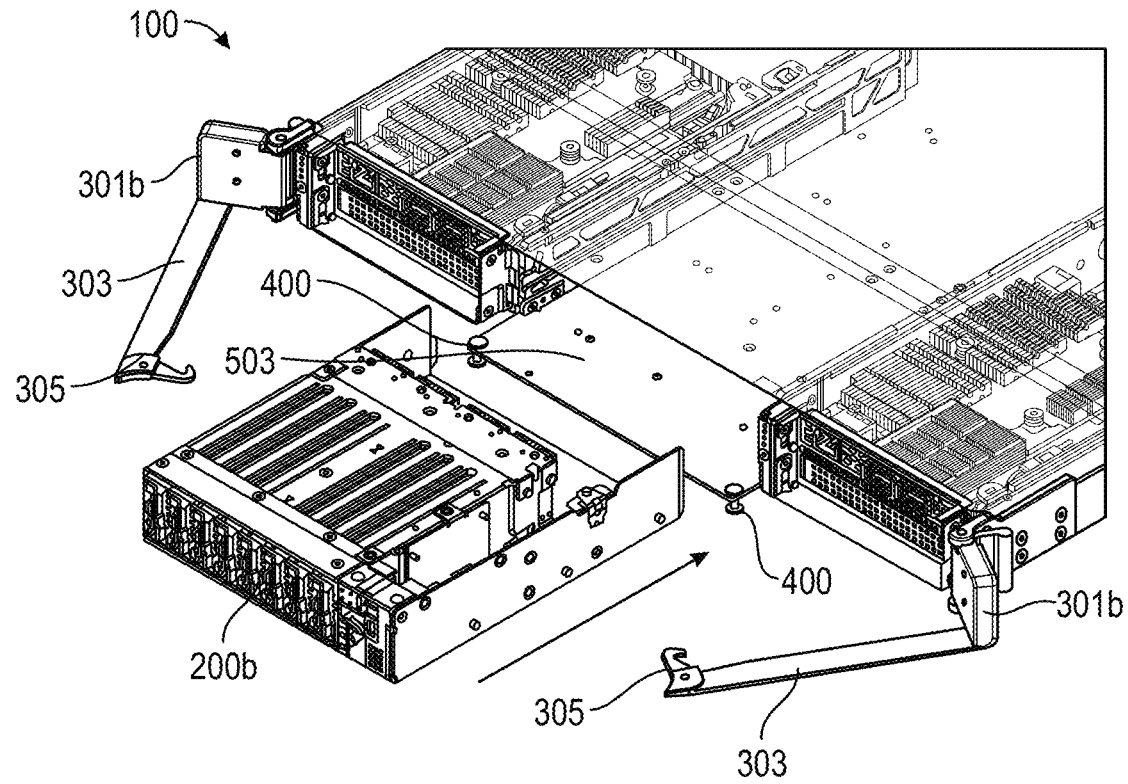
FIG. 8B illustrates installing a server module into a server chassis while a lever is in an open position, according to certain aspects of the present disclosure.

Referring to FIG. 8B, once the server module 200a is pulled out, as shown in FIG. 8A, a replacement server module 200b can be inserted into the slot of the base 500 while the levers 300 are positioned in the open state and while the adjustable pins 400 are positioned in the lowered configuration.

Referring to FIG. 9A, once the replacement server module 200b is installed in the server chassis 100, the adjustable pin 400 that is positioned in the lowered configuration receives a user input (a finger pushing the pin base 401) to raise the adjustable pin 400. In response to the push input received on the pin base 401 of the adjustable pin 400 that is positioned in the lowered configuration, the adjustable pin 400 is configured to be raised or move upward. The expanded locking ball 407 is retracted upon contacting the base plate 503 of the base 500 to allow the adjustable pin 400 pass through the through-hole 501 (shown in FIG. 2B) of the base plate 503. The retracted locking ball 407 is expanded after the locking ball 407 passes through the through-hole 501 of the base plate 503. Eventually, the adjustable pin 400 is positioned in the raised configuration, as shown in FIG. 9B.

Referring to FIGS. 10A and 10B, once the adjustable pins 400 are positioned in the raised configuration, the levers 300 are closed in response to user input received via the tabs 307 (shown in FIG. 3) of the levers 300. In response to movement of the arms 303 caused by the user input, the hook structures 305 are engaged with respective adjustable pins 400 that are positioned in the raised configuration to secure the replacement server module 200b installed within the server chassis 100.

Referring to FIGS. 6-10A, according to various embodiments of the present disclosure, a method of replacing a server module in a server chassis is described. As shown in FIG. 6, first, the levers 300 are opened. For example, the levers 300 are opened in response to user input received via the tabs 307 (shown in FIG. 3) of the levers 300. Once the levers 300 are open, the adjustable pins 400 are lowered as shown in FIGS. 7A and 7B. For example, user input is received via the caps 405 of the adjustable pins 400, as shown in FIG. 7A, to lower the adjustable pins 400. Once the adjustable pins 400 are lowered to the lowered configuration, as shown in FIG. 7B, the server module 200a is pulled out of the server chassis 100 or the slot of the base 500, as shown in FIG. 8A. Then, the replacement server module 200b is inserted into the slot of the base 500 or server chassis 100, as shown in FIG. 8B while the adjustable pins 400 are positioned in the lowered configuration. Once the replacement server module 200b is installed in the server chassis 100, the adjustable pins 400 that are positioned in the lowered configuration are raised to the raised configuration, as shown in FIGS. 9A and 9B. For example, as shown in FIG. 9A, user input is received via the pin bases 401 of the adjustable pins 400 to raise the adjustable pins 400. Once the adjustable pins 400 are positioned in the raised configuration, as shown in FIG. 9B, the levers 300 are closed, as shown in FIGS. 10A and 10B. For example, user input is received via the tabs 307 (shown in FIG. 3) to close the levers 300. In response to the movement of the arms 303 of the levers 300 caused by the user input, the hook structures 305 of the levers 300 are engaged with the raised adjustable pins 400 to secure the replacement server module 200b in the server chassis 100.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A server chassis comprising:
a base having at least one slot configured to receive a server module on a base plate;
a pair of levers coupled to the base; and
a pair of adjustable pins coupled to the base plate, each adjustable pin of the pair of adjustable pins being configured to engage with a corresponding one of the pair of levers,
wherein each adjustable pin is movable relative to the base plate.

2. The server chassis of claim 1, wherein the base includes a first side wall formed at one edge of the base plate and a second side wall formed at another edge of the base plate, and
wherein one of the pair of levers is coupled to the first side wall, and another one of the pair of levers is coupled to the second side wall.

3. The server chassis of claim 2, wherein each of the pair of levers includes:
a lever base coupled to the first or second side wall of the base;
an arm coupled to the lever base; and
a hook structure coupled to the arm.

4. The server chassis of claim 3, wherein the lever base includes a fixed portion coupled to the first or second side wall of the base.

5. The server chassis of claim 4, wherein the lever base further includes a movable portion pivotably coupled to the fixed portion, the arm being coupled to the movable portion.

6. The server chassis of claim 5, wherein the lever base further includes a tab extending from the movable portion, the tab being configured to receive a user input for moving the arm such that the pair of levers are disengaged from the pair of adjustable pins or the pair of levers are engaged with the pair of adjustable pins in response to movement of the arm.

7. The server chassis of claim 3, wherein the hook structure is pivotally coupled to the arm.

8. The server chassis of claim 7, wherein the hook structure is configured to engage with a corresponding one of the pair of adjustable pins.

9. The server chassis of claim 8, wherein each of the pair of adjustable pins is inserted into a corresponding through-hole of the base plate.

10. The server chassis of claim 9, wherein each of the pair of adjustable pins includes:

a pin base;

an elongated body passing through the through-hole of the base plate, one end of the elongated body being coupled to the pin base; and a cap coupled to another end of the elongated body.

11. The server chassis of claim 10, wherein the elongated body of the adjustable pin has a generally cylindrical shape.

12. The server chassis of claim 10, wherein the cap is removably coupled to the elongated body.

13. The server chassis of claim 10, wherein the pin base is located below the base plate, and the cap is located above the base plate.

14. The server chassis of claim 10, wherein the adjustable pin is configured to be positioned in either a raised configuration or a lowered configuration, positioning of the adjustable pin being according to movement of the adjustable pin through the through-hole of the base plate.

15. The server chassis of claim 14, wherein the hook structure is configured to engage with the adjustable pin when the adjustable pin is positioned in the raised configuration, and wherein the hook structure cannot engage with the adjustable pin when the adjustable pin is positioned in the lowered configuration.

16. A server comprising:

a base including a base plate with a pair of through-holes, a first side wall formed at one edge of the base plate, and a second side wall formed at another edge of the base plate, the base having at least one slot configured to receive a server module;

a pair of levers, one of the pair of levers being coupled to the first side wall, and another one of the pair of levers being coupled to the second side wall; and a pair of adjustable pins coupled to the base plate, each adjustable pin of the pair of adjustable pins being configured to engage with a corresponding one of the pair of levers, the adjustable pin including:

a pin base;

an elongated body passing through a corresponding one of the pair of through-holes of the base plate, one end of the elongated body being coupled to the pin base;

a locking ball positioned at a portion of the elongated body, the locking ball being configured to be in an expanded state or in a retracted state; and a cap coupled to another end of the elongated body, wherein each adjustable pin is movable relative to the base plate to be positioned in either a raised configuration or a lowered configuration, positioning of the adjustable pin being according to movement of the adjustable pin through the corresponding through-hole of the base plate, and wherein the pair of levers are configured to be closed to secure the received server module within the base, and the pair of levers are configured to be opened to allow pulling out the server module from the slot or the base.

17. The server of claim 16, wherein, when the adjustable pin is positioned in the raised configuration, the cap is positioned away from a top side of the base plate and the pin base is positioned close to or in contact with a bottom side of the base plate, and wherein, when the adjustable pin is positioned in the lowered configuration, the pin base is positioned away from the bottom side of the base plate and the cap is positioned close to or in contact with the top side of the base plate.

18. The server of claim 16, wherein when the adjustable pin is positioned in the raised configuration, the locking ball positioned above the base plate is in the expanded state, and wherein when the adjustable pin is positioned in the lowered configuration, the locking ball positioned below the base plate is in the expanded state.

19. The server of claim 18, wherein in response to a push input received on the cap of the adjustable pin that is positioned in the raised configuration, the adjustable pin is configured to be lowered or move downward, the expanded locking ball being retracted upon contacting the base plate of the base to allow the adjustable pin pass through the through-hole of the base plate, and the retracted locking ball being expanded after the locking ball passes through the through-hole of the base plate, such that the adjustable pin is eventually positioned in the lowered configuration.

20. The server of claim 18, wherein in response to a push input received on the pin base of the adjustable pin that is positioned in the lowered configuration, the adjustable pin is configured to be raised or move upward, the expanded locking ball being retracted upon contacting the base plate of the base to allow the adjustable pin pass through the through-hole of the base plate, and the retracted locking ball being expanded after the locking ball passes through the through-hole of the base plate, such that the adjustable pin is eventually positioned in the raised configuration.

* * * * *